(12) United States Patent
Lee et al.

(10) Patent No.: US 11,125,824 B2
(45) Date of Patent: *Sep. 21, 2021

(54) MASTER BATTERY MANAGEMENT UNIT USING POWER FROM BATTERY MODULE

(71) Applicant: LG CHEM, LTD., Seoul (KR)

(72) Inventors: Keun-Wook Lee, Daejeon (KR); Sang-Hoon Lee, Daejeon (KR); Hyun-Ki Cho, Daejeon (KR); Yean-Sik Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 170 days.

This patent is subject to a terminal disclaimer.

(21) Appl. No.: 16/476,777

(22) PCT Filed: Jun. 14, 2018

(86) PCT No.: PCT/KR2018/006719
§ 371 (c)(1),
(2) Date: Jul. 9, 2019

(87) PCT Pub. No.: WO2019/022377
PCT Pub. Date: Jan. 31, 2019

(65) Prior Publication Data
US 2019/0361075 A1 Nov. 28, 2019

(30) Foreign Application Priority Data
Jul. 25, 2017 (KR) .......................... 10-2017-0094254

(51) Int. Cl.
*H02J 7/00* (2006.01)
*G01R 31/3835* (2019.01)
(Continued)

(52) U.S. Cl.
CPC .... *G01R 31/3835* (2019.01); *H01M 10/4207* (2013.01); *H01M 10/482* (2013.01);
(Continued)

(58) Field of Classification Search
CPC .................................................. G01R 31/3835
(Continued)

(56) References Cited

U.S. PATENT DOCUMENTS 6,483,275 B1 11/2002 Nebrigic et al.
2008/0061764 A1 3/2008 Tae et al.
(Continued)

FOREIGN PATENT DOCUMENTS

EP 2 980 912 A1 2/2016
JP 3809336 B2 8/2006
(Continued)

OTHER PUBLICATIONS

International Search Report for PCT/KR2018/006719 (PCT/ISA/210) dated Oct. 4, 2018, with English translation.
(Continued)

*Primary Examiner* — Yalkew Fantu
(74) *Attorney, Agent, or Firm* — Birch, Stewart, Kolasch & Birch, LLP (57) ABSTRACT

A master battery management unit including a sensing unit generating pack information of the battery pack, a first master power supply unit generating a first operating voltage using voltage of the battery pack, a communication unit outputting a first switching signal in response to the first operating voltage supplied from the first master power supply unit, a second master power supply unit generating a second operating voltage using the pack voltage in response to the first switching signal, and a control unit operating using the second operating voltage supplied from the second master power supply unit, and testing a preset item based on at least one of the pack information and module information.

12 Claims, 4 Drawing Sheets (51) Int. Cl.
*H01M 10/42* (2006.01)
*H01M 10/48* (2006.01)
*H02J 1/10* (2006.01)
*H01M 50/20* (2021.01)

(52) U.S. Cl.
CPC ............. *H01M 50/20* (2021.01); *H02J 1/102* (2013.01); *H02J 7/0021* (2013.01); *H02J 7/0022* (2013.01); *H01M 2010/4278* (2013.01); *H01M 2220/30* (2013.01); *H02J 1/106* (2020.01)

(58) Field of Classification Search
USPC .......................................................... 320/132
See application file for complete search history.

(56) References Cited

U.S. PATENT DOCUMENTS

| | | | |
|---|---|---|---|
| 2010/0055543 A1 | 3/2010 | Tae et al. | |
| 2013/0257383 A1 | 10/2013 | Shim | |
| 2014/0210420 A1 | 7/2014 | Lee et al. | |
| 2014/0347013 A1* | 11/2014 | Kim | G01R 31/382 320/134 |
| 2016/0137091 A1 | 5/2016 | Yamazoe et al. | |
| 2016/0261127 A1* | 9/2016 | Worry | H01M 10/425 |
| 2016/0294019 A1 | 10/2016 | Yamauchi et al. | |
| 2018/0040922 A1* | 2/2018 | Sung | H01M 50/502 |
| 2019/0260097 A1* | 8/2019 | Kwon | B60L 50/50 |
| 2020/0106278 A1* | 4/2020 | Sung | H02J 50/40 |

FOREIGN PATENT DOCUMENTS

| | | |
|---|---|---|
| JP | 5576498 B2 | 8/2014 |
| JP | 2014-230488 A | 12/2014 |
| JP | 2015-527047 A | 9/2015 |
| JP | 2015-197729 A | 7/2016 |
| JP | WO2015/092846 A1 | 3/2017 |
| KR | 10-0846710 B1 | 7/2008 |
| KR | 10-1251812 B1 | 4/2013 |
| KR | 10-2014-0028350 A | 3/2014 |
| KR | 10-1448526 B1 | 10/2014 |
| KR | 10-1463115 B1 | 11/2014 |
| KR | 10-2015-0137583 A | 12/2015 |
| KR | 10-1597320 B1 | 2/2016 |
| KR | 10-1613230 B1 | 4/2016 |
| KR | 10-1621857 B1 | 5/2016 |
| KR | 10-1641435 B1 | 7/2016 |
| KR | 10-2016-0109640 A | 9/2016 |
| WO | WO 2016/075797 A1 | 5/2016 |

OTHER PUBLICATIONS

European Search Report dated Mar. 27, 2020 in EP Patent Application No. 18837537.2.

* cited by examiner

MASTER BATTERY MANAGEMENT UNIT USING POWER FROM BATTERY MODULE

TECHNICAL FIELD

The present disclosure relates to a battery management unit, and more particularly, to a master battery management unit for controlling slave battery management units installed in a plurality of battery modules included in a battery module one-to-one and a battery pack including the same.

The present application claims priority to Korean Patent Application No. 10-2017-0094254 filed in the Republic of Korea on Jul. 25, 2017, the disclosures of which are incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance secondary batteries that can be recharged repeatedly.

Currently, commercially available secondary batteries include nickel-cadmium batteries, nickel-hydrogen batteries, nickel-zinc batteries, lithium secondary batteries and the like, and among them, lithium secondary batteries are gaining attention due to advantages of charging and discharging freely in the absence of a memory effect, a very low self-discharge rate, and high energy density as compared to nickel-based secondary batteries.

A battery pack applied to electric vehicles generally includes a plurality of battery modules connected in series and a plurality of battery management units. The battery management unit may be called a Battery Management Unit (BMU). Each BMU monitors and controls the state of the battery module each BMU manages. Recently, to meet the demand for high-capacity high-output battery packs, the number of battery modules included in a battery pack also increases. To efficiently manage the state of each battery module included in the battery pack, a single master-multi slave structure is disclosed. The single master-multi slave structure includes a plurality of slave BMUs installed in each battery module and a master BMU to control the overall operation of the plurality of slave BMUs. In this instance, communication between the plurality of slave BMUs and the master BMU may be made in either wired manner or wireless manner or both.

Each slave BMU and the master BMU include a variety of circuit components and a plurality of electrical lines connecting them. Particularly, for the master BMU to normally control the operation of the plurality of slave BMUs, the premise is normal operation of each slave BMU. This is because a defect in even a single slave BMU may have a great influence on the overall performance of the battery pack.

Accordingly, it is necessary to conduct a test to determine if the master BMU normally operates, i.e., a defect exists in the master BMU during the period from the time the master BMU is installed in the battery pack to the time the battery pack is released.

However, conventionally, to test preset items on the master BMU, prior to the test, an operator needs to connect a separate power source such as a lead-acid battery to the master BMU manually to wake-up the master BMU, and due to this limitation, there is a disadvantage of an inefficient preparation process for test.

DISCLOSURE

Technical Problem

The present disclosure is directed to providing a master BMU for testing the items required to normally control a plurality of slave BMUs without a process of connecting a power source by an operator manually and a battery pack including the same.

These and other objects and advantages of the present disclosure will be understood by the following description and will be apparent from the embodiments of the present disclosure. Further, it will be readily understood that the objects and advantages of the present disclosure are realized by the means set forth in the appended claims and combinations thereof.

Technical Solution

Various embodiments of the present disclosure for achieving the above-described object are as follows.

A battery management unit according to an aspect of the present disclosure is for a battery pack including a plurality of battery modules and a plurality of slave battery management units installed in the plurality of battery modules one-to-one. The master battery management unit includes a sensing unit configured to detect an electrical parameter including a pack voltage of the plurality of battery modules of the battery pack, and generate pack information based on the detected electrical parameter, a first master power supply unit configured to generate a first operating voltage using the pack voltage supplied from the plurality of battery modules, a communication unit including an antenna and a wireless communication circuit operably connected to each other, and configured to operate using the first operating voltage supplied from the first master power supply unit, and output a first switching signal in response to the first operating voltage, a second master power supply unit configured to generate a second operating voltage using the pack voltage supplied from the plurality of battery modules in response to the first switching signal, and a control unit configured to operate using the second operating voltage supplied from the second master power supply unit, and test a preset item based on at least one of the pack information and module information from the plurality of slave battery management units.

Additionally, the master battery management unit may further include a third master power supply unit configured to generate a third operating voltage using the second operating voltage supplied from the second master power supply unit. In this case, the control unit may further operate using the third operating voltage.

Additionally, the master battery management unit may further include a third master power supply unit configured to generate a third operating voltage using the second operating voltage supplied from the second master power supply unit. In this case, the control unit may operate using the third operating voltage.

Additionally, the master battery management unit may further include an isolation unit configured to relay communication between at least one of the plurality of slave battery management units, the sensing unit and the communication unit and the control unit.

Additionally, the control unit may output the first switching signal independently of the communication unit while the control unit is in operation.

Additionally, the master battery management unit may further include an OR circuit including a first input terminal, a second input terminal and an out terminal. The first input terminal of the OR circuit may receive an input of the first switching signal from the communication unit, and the second input terminal of the OR circuit may receive an input of the first switching signal from the control unit. In this case, the output terminal of the OR circuit may output the first switching signal from the communication unit or the first switching signal from the control unit to the second master power supply unit.

Additionally, the control unit may stop outputting the first switching signal and output a second switching signal that is independent of the first switching signal when the control unit is electrically connected to an auxiliary power source provided in an object in which the battery pack is mounted. In this case, the first master power supply unit may stop generating the first operating voltage supplied for operation of the communication unit in response to the second switching signal.

Additionally, the communication unit may transmit a RF signal indicating a result of the test to an external operator terminal through the antenna and the wireless communication circuit.

A battery management system according to another aspect of the present disclosure includes the master battery management unit.

A battery pack of claim 7 according to still another aspect of the present disclosure includes the battery management unit.

Advantageous Effects

The master BMU according to at least one of the embodiments of the present disclosure can test the items required to normally control a plurality of slave BMUs by using electrical energy of at least one battery module without a process of connecting a power source by an operator manually.

Additionally, the master BMU according to at least one of the embodiments of the present disclosure can transmit the test results to the outside (for example, the operator's terminal) in wireless manner.

Additionally, the master BMU according to at least one of the embodiments of the present disclosure can change the function of a wireless communication circuit depending on whether or not a battery pack including a battery management system is installed in a preset object (for example, an electric vehicle).

The effects of the present disclosure are not limited to the above-mentioned effects, and other effects not mentioned herein will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide further understanding of the technical aspects of the present disclosure, and thus, the present disclosure should not be construed as being limited to the drawings.

MODE FOR CARRYING OUT THE INVENTION

Hereinafter, preferred embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and variations could be made thereto at the time of filing the application.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term <control unit> as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

Hereinafter, a battery management system including a plurality of battery management units according to the embodiments of the present disclosure will be described. In this instance, at least one of the plurality of BMUs may be a master BMU, and the others may be slave BMUs.

Figure 1:
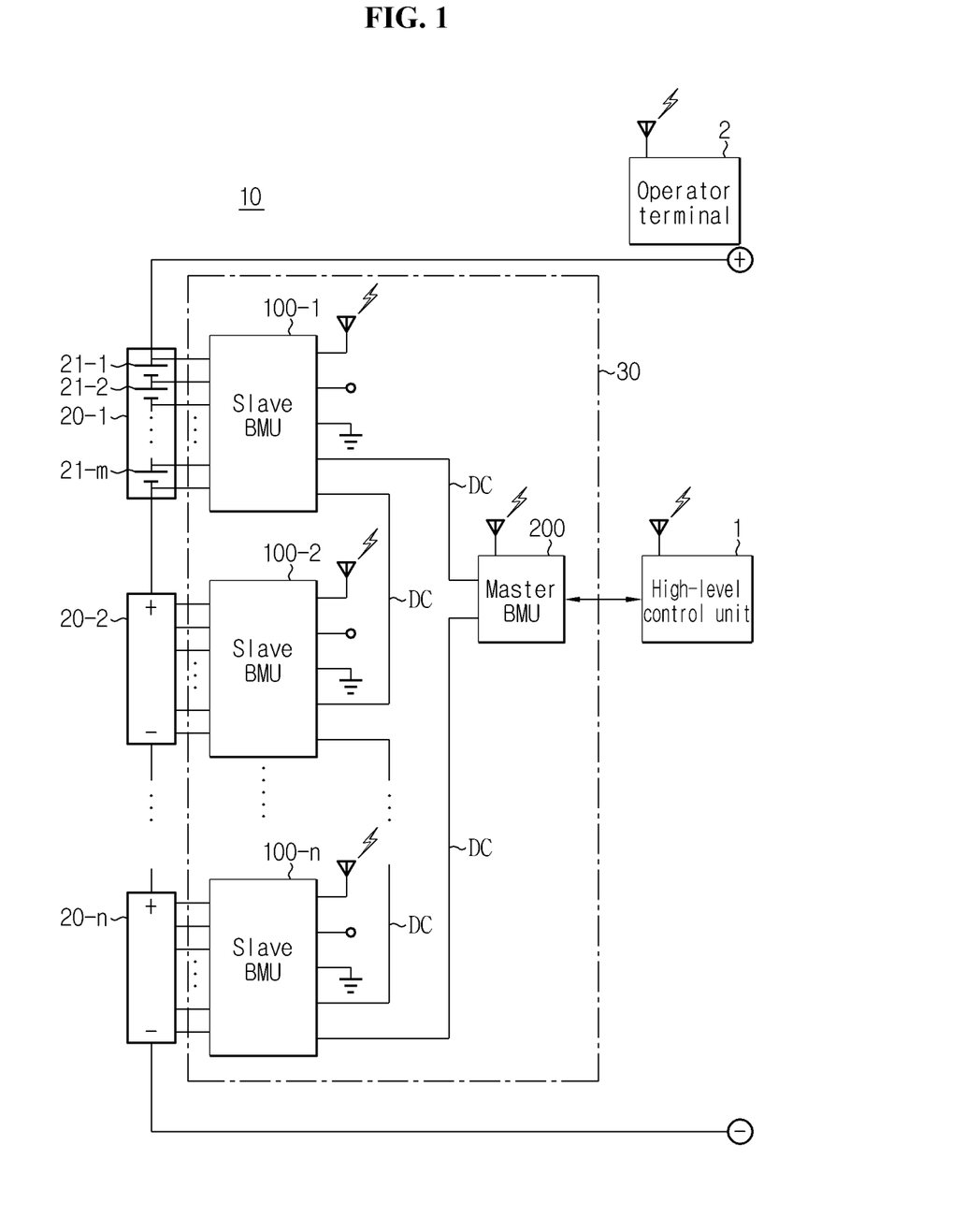
FIG. 1 is a schematic diagram showing configuration of a battery management system according to an embodiment of the present disclosure and a battery pack including the same.

FIG. 1 is a schematic diagram showing configuration of a battery management system 30 according to an embodiment of the present disclosure and a battery pack 10 including the same.

Referring to FIG. 1, the battery pack 10 includes a plurality of battery modules 20 and a battery management system 30. Each battery module 20 may include at least one battery cell 21. The battery management system 30 includes a plurality of slave BMUs 100 and at least one master BMU

200. The battery pack 10 is mounted in an electric vehicle to supply the power required to operate an electric motor of the electric vehicle.

Hereinafter, for convenience of description, assume that the battery pack 10 includes n (n is a natural number that is equal to or greater than 2) battery modules 20-1~20-$n$ connected in series, each battery module 20 includes m (m is a natural number that is equal to or greater than 2) battery cells 21 connected in series, and the battery management system 30 includes n slave BMUs 100 and a single master BMU 200.

The plurality of slave BMUs 100-1~100-$n$ is installed such that the plurality of slave BMUs 100-1~100-$n$ matches the plurality of battery modules 20-1~20-$n$ included in the battery pack 10 one-to-one.

Each of the plurality of slave BMUs 100-1~100-$n$ is electrically connected to a battery module 20-$j$ in which each of the plurality of slave BMUs 100-1~100-$n$ is installed among the plurality of battery modules 20-1~20-$n$. Here, j is a natural number that is equal to or greater than 1 and is equal to or less than n.

Each of the plurality of slave BMUs 100-1~100-$n$ detects the overall state (for example, voltage, current, temperature) of the battery module 20-$j$ electrically connected to each of the plurality of slave BMUs 100-1~100-$n$, and performs a variety of control functions (for example, charging, discharging, balancing) to adjust the state of the battery module 20. In this instance, each control function may be performed directly by the slave BMU 100 based on the state of the battery module 20, or may be performed according to the command from the master BMU 200.

The plurality of slave BMUs 100-1~100-$n$ and the master BMU 200 may be in communication connection with each other via a wired network such as Daisy Chain.

Figure 2:
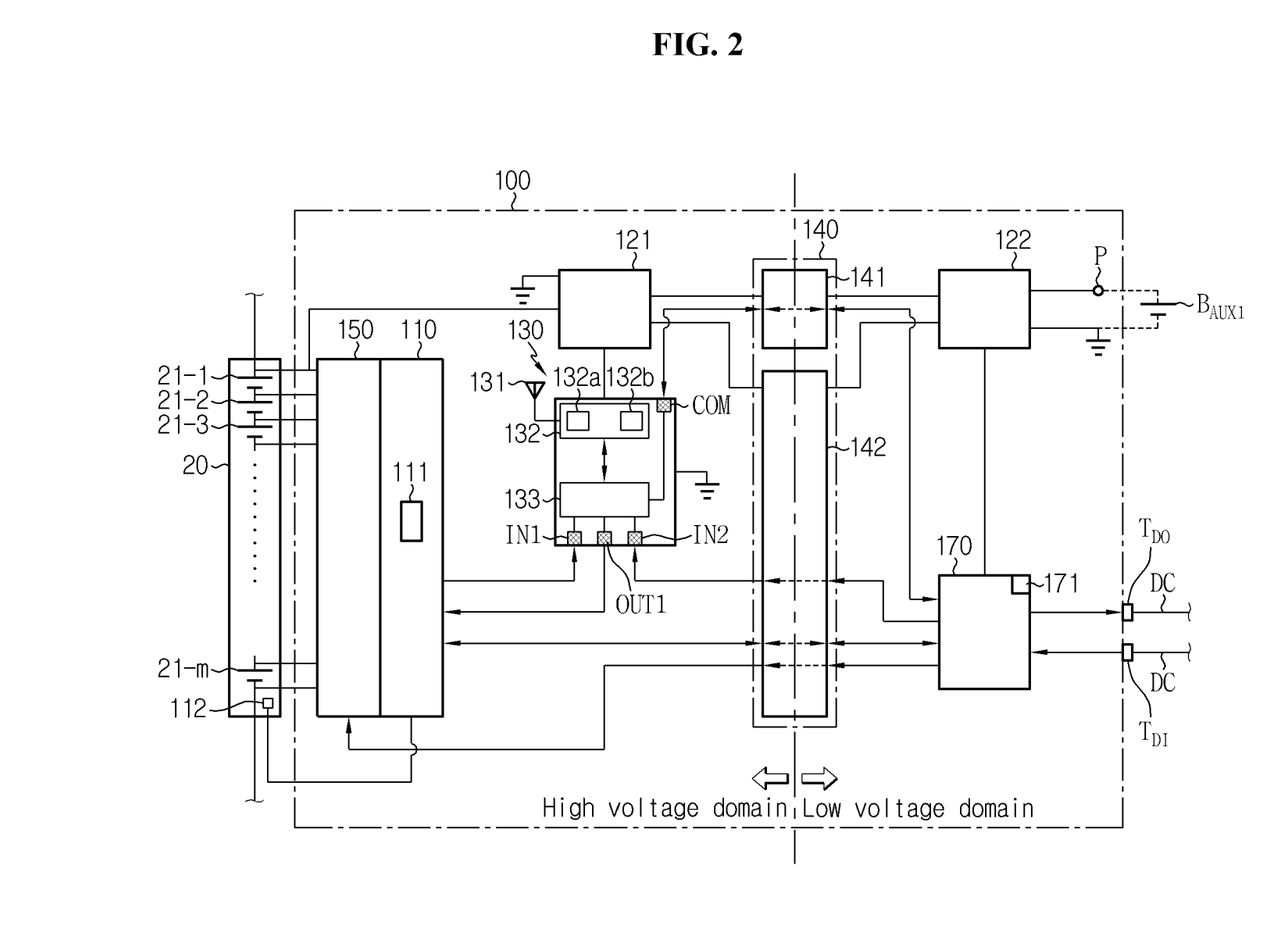
FIG. 2 is a schematic diagram showing configuration of a slave BMU according to an embodiment of the present disclosure.
Figure 3:
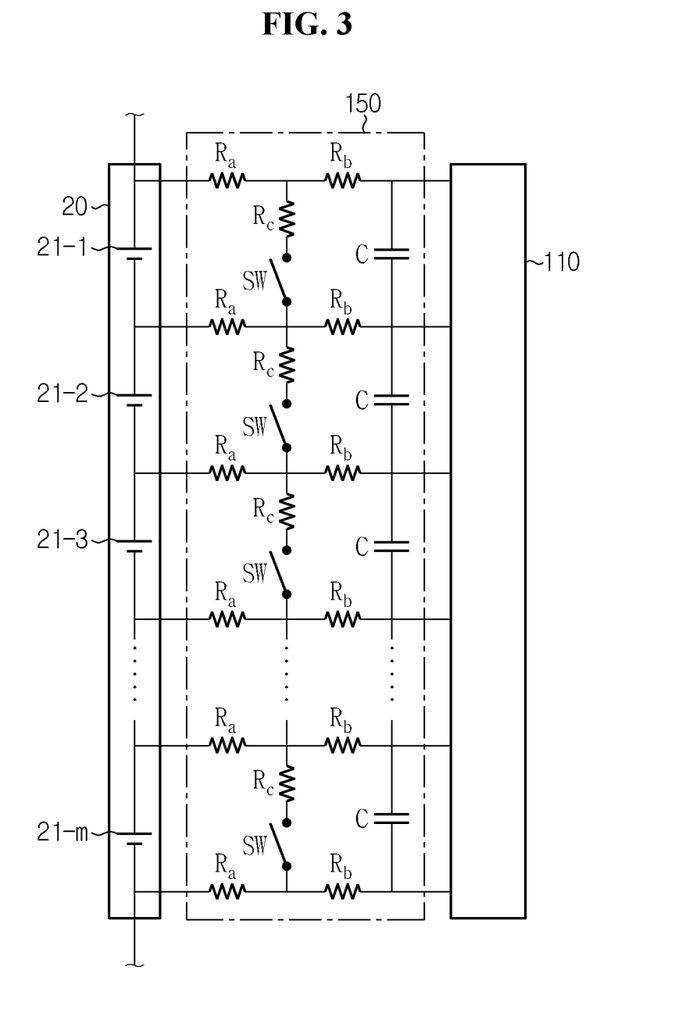
FIG. 3 is a schematic diagram showing configuration of a cell balancing unit shown in FIG. 2.

FIG. 2 is a schematic diagram showing configuration of the slave BMU 100 according to an embodiment of the present disclosure, and FIG. 3 is a schematic diagram showing configuration of a cell balancing unit 150 according to an embodiment of the present disclosure.

Referring to FIGS. 1 and 2, each slave BMU 100 may include a sensing unit 110, a first power supply unit 121 and a communication unit 130. Optionally, each slave BMU 100 may further includes at least one of a second power supply unit 122, an isolation unit 140, a cell balancing unit 150, a memory 160 and a control unit 170.

The sensing unit 110 is configured to detect electrical parameters representing the state of the battery module 20. Specifically, the sensing unit 110 includes a voltage measurement circuit to detect the voltage of each battery cell 21 included in the battery module 20, and optionally, may further include a temperature detection circuit to detect the temperature of the battery module 20.

The voltage measurement circuit of the sensing unit 110 detects the voltage across each battery cell 21 using a voltage sensor 111 electrically connected to each battery cell 21 through a plurality of electrical lines, and generates voltage information representing the detected voltage.

Additionally, the temperature detection circuit of the sensing unit 110 detects the temperature of the battery module 20 or at least one battery cell 21 included in the battery module 20 using a temperature sensor 112 disposed in the battery module 20 or at a predetermined distance from the battery module 20, and generates temperature information representing the detected temperature.

The sensing unit 110 outputs a detection signal including at least one of the voltage information and the temperature information. The detection signal outputted by the sensing unit 110 may be received by the communication unit 130. The sensing unit 110 and the communication unit 130 may communicate with each other through one of serial communication modes, for example, Universal Asynchronous Receiver Transmitter (UART) mode.

The first power supply unit 121 may include a device capable of DC-DC voltage conversion, for example, a voltage conversion circuit including at least one of a Low Drop Out (LDO) regulator, a linear regulator and a Switched Mode Power Supply (SMPS). When electrical energy is supplied from the battery module 20, the first power supply unit 121 generates at least one preset operating voltage from the module voltage across the battery module 20 using the voltage conversion circuit. Subsequently, the first power supply unit 121 supplies the operating voltage to other circuits and/or elements included in the slave BMU 100.

For example, the first power supply unit 121 may supply the same level of operating voltage to the sensing unit 110, the communication unit 130, the isolation unit 140 and the cell balancing unit 150. As another example, the first power supply unit 121 may supply, to one of the sensing unit 110, the communication unit 130, the isolation unit 140 and the cell balancing unit 150, operating voltage (for example, 5.0 V) of different level from the operating voltage (for example, 3.3 V) supplied to one of the others.

Alternatively, at least one of the sensing unit 110, the communication unit 130, the isolation unit 140 and the cell balancing unit 150 may convert the module voltage of the battery module 20 to operating voltage required for the operation thereof using a voltage conversion circuit provided therein, rather than the operating voltage supplied by the first power supply unit 121.

The communication unit 130 includes an antenna 131, a wireless communication circuit 132 and a wired communication circuit 133 operably connected to each other, and is configured to operate using the operating voltage supplied from the first power supply unit 121.

The communication unit 130 includes a first input port IN1 electrically connected to the sensing unit 110 through the electrical line, and receives the detection signal from the sensing unit 110 through the first input port IN1. Optionally, the communication unit 130 may further include a second input port IN2. Additionally, the communication unit 130 may further include a first output port OUT1 electrically connected to the sensing unit 110 through the electrical line, and may transmit a control signal requesting the transmission of the detection signal to the sensing unit 110 through the first output port OUT1.

The wireless communication circuit 132 may include a wireless transceiver 132$a$ and a Micro Control Unit (MCU) 132$b$. The wireless transceiver 132$a$ and the MCU 132$b$ may be implemented as a semiconductor integrated into a single chip, and this may be called 'RF(Radio Frequency)-SoC (System on Chip)'.

The MCU 132$b$ may test at least one item related to the battery module 20 based on the detection signal from the sensing unit 110 while the control unit 170 as described below is in an inactive state (i.e., power source voltage is not supplied). For example, the at least one item to test may include a failure in the sensing unit 110 or a failure in the cell balancing unit 150.

Additionally, the MCU 132$b$ transmits the test result information indicating the result of the test performed by the MCU 132$b$ to the wireless transceiver 132$a$. The wireless transceiver 132$a$ may transmit a RF signal including the test result information from the MCU 132$b$ to an operator terminal 2 or the master BMU 200 through the antenna 131.

The wireless communication circuit 132 may demodulate the wireless signal received by the antenna 131. The wireless signal received by the antenna 131 may be transmitted from the outside, for example, the master BMU 200 or other slave BMU 100.

The wired communication circuit 133 is electrically connected to the first input port IN1 and the first output port OUT1 to support a wired communication between the communication unit 130 and the sensing unit 110.

The second power supply unit 122 includes a voltage conversion circuit connected to a power source terminal P provided in the slave BMU 100 including the second power supply unit 122. The voltage conversion circuit of the second power supply unit 122 may include a device capable of DC-DC voltage conversion, for example, at least one of a LDO regulator, a linear regulator and an SMPS.

When the power source $B_{AUX1}$ (for example, a lead-acid battery of an electric vehicle) is connected to the power source terminal P, the second power supply unit 122 is configured to convert the power source voltage of the power source $B_{AUX1}$ to at least one preset operating voltage using the voltage conversion circuit of the second power supply unit 122. Subsequently, the second power supply unit 122 supplies the operating voltage to other circuits or elements included in the slave BMU 100.

For example, the second power supply unit 122 may supply the same level of operating voltage to the isolation unit 160 and the control unit 170. As another example, the second power supply unit 122 may supply, to one of the isolation unit 160 and the control unit 170, operating voltage (for example, 5.0 V) of different level from the operating voltage (for example, 3.3 V) supplied to the other.

Alternatively, the control unit 170 may convert the power source voltage to another operating voltage required for the operation thereof using a voltage conversion circuit provided therein, rather than the operating voltage supplied by the second power supply unit 122.

The isolation unit 140 is configured to operate using the operating voltage supplied from the first power supply unit 121 and the operating voltage supplied from the second power supply unit 122. The isolation unit 140 supports communication between the components belonging to high voltage domain and the components belonging to low voltage domain while maintaining the electrical isolation between high voltage domain and low voltage domain of the slave BMU 100. In the present disclosure, 'high voltage domain' may refer to a part that is electrically connected to the battery module 20 and operates on the electrical energy supplied from the battery module 20. For example, the sensing unit 110, the first power supply unit 121 and the communication unit 130 belong to the high voltage domain.

'Low voltage domain' may refer to the remaining part of the slave BMU 100 except the high voltage domain. For example, the second power supply unit 122 and the control unit 170 belong to the low voltage domain.

The isolation unit 140 includes a first isolation circuit 141. The first isolation circuit 141 relays communication between the communication unit 130 and the control unit 170 using the operating voltage supplied form the first power supply unit 121 and the operating voltage supplied from the second power supply unit 122. That is, the signal from the communication unit 130 is transmitted to the control unit 170 through the first isolation circuit 141, and the signal from the control unit 170 is transmitted to the communication unit 130 through the first isolation circuit 141.

The isolation unit 140 may further include a second isolation circuit 142. The second isolation circuit 142 relays communication between the sensing unit 110 and the control unit 170 using the operating voltage supplied from the first power supply unit 121 and the operating voltage supplied from the second power supply unit 122. Additionally, the second isolation circuit 142 may relay communication between the cell balancing unit 150 and the control unit 170.

Each of the first isolation circuit 141 and the second isolation circuit includes at least one isolation element. Each isolation element includes a transmitter and a receiver, and may be a digital isolator, an opto coupler or a RF isolator with an isolation barrier between the input side and the output side. For example, when an opto coupler is used for the isolation element, the transmitter may be a light source such as a LED, and the receiver may be an optical detector such as a photo diode. As another example, when a RF isolator is used for the isolation element, the transmitter may be RF XMTR, and the receiver may be RF RCVR.

One of the transmitter and the receiver of the isolation element may be electrically connected to the high voltage domain side, while the other may be electrically connected to the low voltage domain side.

The second isolation circuit 142 may include the number of isolation elements that is equal to or larger than the number of battery cells 21 included in the battery module 20. Preferably, the second isolation circuit 142 may include at least m+1 isolation elements. Among them, m isolation elements transmit a signal representing the voltage of each of m battery cells 21 outputted by the sensing unit 110 to the control unit 170. One remaining isolation element transmits a control signal outputted by the control unit 170 to the sensing unit 110.

The cell balancing unit 150 is configured to selectively perform cell balancing of each of the plurality of battery cells 21 included in each battery module 20 in response to the balancing command from the communication unit 130 or the control unit 170. The cell balancing unit 150 performs cell balancing. For example, the cell balancing unit 150 discharges the battery cell 21 having higher remaining capacity than the other battery cell 21 among the plurality of battery cells 21-1~21-m included in the common battery module 20 to equalize the remaining capacity between the plurality of battery cells 21-1~21-m included in the common battery module 20.

Referring to FIG. 3, the cell balancing unit 150 includes a plurality of balancing resistors $R_C$ and a plurality of balancing switches SW. A series circuit including one balancing resistor $R_C$ and one balancing switch SW is connected between two ends of each battery cell 21. Accordingly, the number of battery cells 21 per the battery module 20 may be equal to the number of balancing resistors $R_C$ and the number of balancing switches SW included in each cell balancing unit 150.

When the voltage or remaining capacity of a battery cell 21-j (j is a natural number between 1~m) is higher than other battery cell 21, the balancing switch SW connected between two ends of the battery cell 21-j is turned on, and electrical energy of the battery cell 21 is consumed by the balancing resistor Rc.

The cell balancing unit 150 may further include a plurality of diagnosis resistors $R_a$, a plurality of protection resistors $R_b$ and/or a plurality of protection capacitors C.

The plurality of diagnosis resistors $R_a$ is used to detect a failure in the cell balancing unit 150. One diagnosis resistor $R_a$ is connected to each electrode of each battery cell 21. The failure in the cell balancing unit 150 may be, for example, a disconnection of the electrical line connecting each battery cell 21 and the cell balancing unit 150 or a malfunction of the balancing switch SW. Referring to FIG. 3, adjacent two battery cells 21 are connected to a diagnosis resistor $R_a$ together, and thus the cell balancing unit 150 may include a total of m+1 diagnosis resistors $R_a$.

The plurality of protection resistors $R_b$ prevents overcurrent from flowing in the sensing unit 110. One protection resistor $R_b$ is connected to each end of each series circuit. Accordingly, the cell balancing unit 150 may include a total of m+1 protection resistors $R_b$.

The plurality of protection capacitors C acts as a RC filter together with the plurality of protection resistors $R_b$. The RC filter is used to filter off noise (for example, sharp change in current) entering the sensing unit 110 through the cell balancing unit 150. Each protection capacitor C is connected to each battery cell 21 in parallel, and thus the cell balancing unit 150 may include a total of m protection resistors $R_b$.

The wireless communication circuit 132 may output a control signal to turn on or off each balancing switch SW included in the cell balancing unit 150, and receive the detection signal outputted by the sensing unit 110. When each balancing switch SW is turned on or off, the voltage of each battery cell 21 indicated by the detection signal outputted by the sensing unit 110 may change. Accordingly, the MCU 132b of the wireless communication circuit 132 may conduct a test to determine a failure in each balancing switch SW or a disconnection of the electrical line in the cell balancing unit 150 based on the detection signal.

The control unit 170 includes at least one processor that operates using the power source voltage supplied from the second power supply unit 122 and a memory 171. The memory 171 may be included in the control unit 170.

The control unit 170 may be operably connected to the communication unit 130 through the first isolation circuit 141, and may be operably connected to the sensing unit 110 through the second isolation circuit 142. When the power source voltage is supplied, the control unit 170 is configured to manage the overall operation of the slave BMU 100 including the control unit 170.

Particularly, the control unit 170 may output a control signal for controlling the sensing unit 110 based on the detection signal received from the sensing unit 110 through the second isolation circuit 142. The control signal outputted to control the sensing unit 110 is transmitted to the sensing unit 110 through the second isolation circuit 142. In this case, the control unit 170 may communicate with the sensing unit 110 through one of serial communication modes, for example Serial Peripheral Interface (SPI) mode.

Each processor included in the control unit 170 may selectively include a processor, an application-specific integrated circuit (ASIC), a chipset, a logic circuit, a register, a communication modem and a data processing device known in the art to execute various control logics. At least one of the various control logics of the control unit 170 may be combined, and the combined control logics may be written in computer-readable code system and recorded in computer-readable recording medium. The recording medium is not limited to a particular type and includes any type of recording media that can be accessed by a processor included in a computer. For example, the recording medium includes at least one selected from the group consisting of ROM, RAM, register, CD-ROM, magnetic tape, hard disk, floppy disk and optical data recording device. Additionally, the code system may be modulated to a carrier signal and included in a communication carrier at a specified point in time and may be stored and executed in computers connected via a network in distributed manner. Additionally, functional programs, codes and code segments for implementing the combined control logics may be readily inferred by programmers in the technical field to which the present disclosure belongs.

The slave BMU 100 may have a pair of signal terminals $T_{DO}$, $T_{DI}$. The control unit 170 may perform a wired communication with other slave BMU 100 and the master BMU 200 through the pair of signal terminals $T_{DO}$, $T_{DI}$. For example, the control unit 170 may receive a signal from other slave BMU 100 or the master BMU 200 through the input terminal $T_{DI}$, and transmit the signal to the master BMU 200 through the output terminal $T_{DO}$.

The memory 171 stores an ID assigned to the slave BMU 100 including the memory 171. The ID may be assigned at the time of manufacturing the slave BMU 100 including the memory 171. The ID may be used for each slave BMU 100 to perform wireless communication with the master BMU 200. The ID assigned to one of the plurality of slave BMUs 100~1~100~n may be different from the ID assigned to each of the remaining slave BMUs.

Each ID may be used for the master BMU 200 to distinguish each slave BMU 100 form the other slave BMUs 100. Additionally, each ID may indicate the battery module in which the slave BMU 100 assigned with the ID is installed among the plurality of battery modules 20~1~20~n.

The memory 171 is not limited to a particular type and includes any known information storage means capable of recording, deleting, updating and reading data. For example, the memory 171 may be DRAM, SDRAM, flash memory, ROM, EEPROM and register. The memory 171 may store program codes defining the processes that can be executed by the control unit 170.

When the operating voltage is supplied from the second power supply unit 122, the control unit 170 may output a switching signal to the communication unit 130. On the contrary, when the supply of the operating voltage from the second power supply unit 122 is stopped, the control unit 170 may stop outputting the switching signal to the communication unit 130. Here, the switching signal may be a voltage signal having a preset level. The switching signal outputted by the control unit 170 may be transmitted to the communication unit 130 through the second isolation circuit 142.

The communication unit 130 receives the switching signal from the control unit 170 through the second input port IN2. The voltage signal having the preset level causes voltage that is higher than a preset threshold voltage on the second input port IN2.

The wired communication circuit 133 electrically connected to the second input port IN2 compares the voltage applied to the second input port IN2 with the preset threshold voltage. When the voltage higher than the threshold voltage is applied to the second input port IN2 while a notification signal transmitted wirelessly by the master BMU 200 is received through the antenna 131, the wired communication circuit 133 inactivates the first input port IN1, and activates a directional communication port COM. The notification signal will be described below in detail with reference to FIG. 4.

Once the first input port IN1 is inactivated, the wired communication circuit 133 cannot receive the detection signal from the sensing unit 110 through the first input port IN1 until the control unit 170 stops outputting the switching signal.

Instead, after the first input port IN1 is inactivated by applying the voltage higher than the threshold voltage to the second input port IN2, the communication unit 130 initiates communication with the control unit 170 through the directional communication port COM.

Specifically, the communication unit 130 demodulates the RF signal from the master BMU 200 received by the antenna 131, and outputs the control signal corresponding to data obtained by demodulation through the directional communication port COM. The control signal outputted from the directional communication port COM is transmitted to the control unit 170 through the first isolation circuit 141. The control unit 170 may control at least one of the sensing unit 110 and the cell balancing unit 150 based on the control signal outputted from the directional communication port COM.

Meanwhile, when the detection signal outputted by the sensing unit 110 is received through the second isolation circuit 142, the control unit 170 transmits the received detection signal to the directional communication port COM of the communication unit 130 through the first isolation circuit 141. Then, the wired communication circuit 133 of the communication unit 130 may transmit the detection signal received through the directional communication port COM to the wireless communication circuit 132, and the wireless communication circuit may transmit the RF signal corresponding to the detection signal to the master BMU 200 through the antenna 131.

Figure 4:
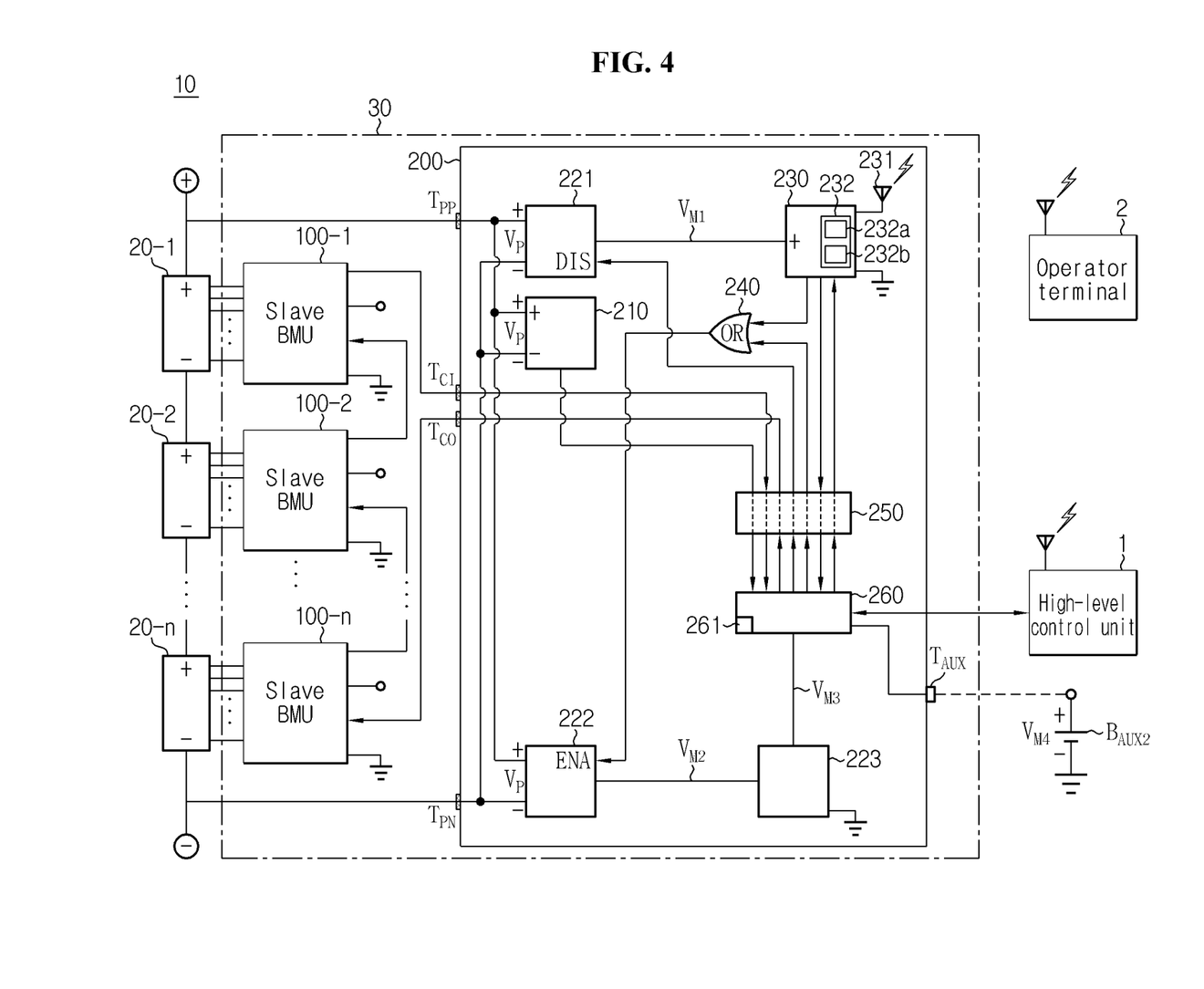
FIG. 4 is a schematic diagram showing configuration of a master BMU according to an embodiment of the present disclosure.

FIG. 4 is a schematic diagram showing configuration of the master BMU 200 according to an embodiment of the present disclosure.

Referring to FIGS. 1 to 4, the master BMU 200 may include a sensing unit 210, at least one of master power supply units 221~223, a communication unit 230, an OR circuit 240, an isolation unit 250, a control unit 260 and a memory 261.

The sensing unit 210 is configured to detect electrical parameters representing the state of the battery pack 10 and generate pack information based on the detected electrical parameters. Specifically, the sensing unit 210 may include a voltage measurement circuit to detect the pack voltage $V_P$ of the battery pack 10, and optionally may further include a current detection circuit to detect the current of the battery pack 10 and/or a temperature detection circuit to detect the temperature of the battery pack 10. The voltage $V_P$ of the battery pack 10 is a voltage between the positive electrode of the first battery module 20-1 having the highest potential and the negative electrode of the $n^{th}$ battery module 20-$n$ having the lowest potential.

When a difference between the sum of module voltages of the plurality of battery modules 20-1~20-$n$ and the pack voltage $V_P$ of the battery pack 10 exceeds a threshold difference, the control unit 260 as described below may output a signal notifying the occurrence of a voltage measurement error to a high-level control unit 1 or the operator terminal 2.

Each of the master power supply units 221~223 may include a device capable of DC-DC voltage conversion, for example, a voltage conversion circuit including at least one of a Low Drop Out (LDO) regulator, a linear regulator and a Switched Mode Power Supply (SMPS).

The first master power supply unit 221 is electrically connected to each of the highest potential terminal (i.e., the positive electrode terminal of the battery module 20-1) and the lowest potential terminal (i.e., the negative electrode terminal of the battery module 20-$n$) of the plurality of battery modules 20-1~20-$n$. The first master power supply unit 221 converts the pack voltage $V_P$ supplied from the plurality of battery modules 20-1~20-$n$ through a pair of power terminals $T_{PP}$, $T_{PN}$ provided in the master BMU 200 to generate a preset operating voltage $V_{M1}$. The pair of power terminals $T_{PP}$, $T_{PN}$ are each electrically connected to the highest potential terminal and lowest potential terminal of the plurality of battery modules 20-1~20-$n$.

Subsequently, the first master power supply unit 221 supplies the operating voltage $V_{M1}$ to the communication unit 230. When the pack voltage $V_P$ is equal to or higher than a predetermined level, the first master power supply unit 221 may have a default mode in which the first master power supply unit 221 can operate without any command from other element such as the control unit 260.

Similar to the first master power supply unit 221, the second master power supply unit 222 converts the pack voltage $V_P$ supplied through the pair of power terminals $T_{PP}$, $T_{PN}$ provided in the master BMU 200 to generate a preset operating voltage $V_{M2}$. Subsequently, the second master power supply unit 222 may supply the operating voltage $V_{M2}$ to the third master power supply unit 223.

The second master power supply unit 222 may generate the operating voltage $V_{M2}$ in response to a first switching signal from the communication unit 230. The second master power supply unit 222 may operate in activated state to generate the operating voltage $V_{M2}$ from the pack voltage $V_P$ only while the pack voltage $V_P$ is equal to or higher than the predetermined level and the first switching signal is being provided to an enable port ENA provided in the second master power supply unit 222.

The third master power supply unit 223 may convert the operating voltage $V_{M2}$ supplied from the second master power supply unit 222 to generate a preset operating voltage $V_{M3}$. Subsequently, the third master power supply unit 223 may supply the operating voltage $V_{M3}$ to the control unit 260. When the operating voltage $V_{M2}$ is equal to or higher than a predetermined level, the third master power supply unit 223 may have a default mode in which the third master power supply unit 223 can operate without any command from other element such as the control unit 260.

Meanwhile, according to an implementation embodiment, the third master power supply unit 223 may be omitted from the battery management system 30. In this case, the second master power supply unit 222 may supply the operating voltage $V_{M2}$ to the control unit 260, not the third master power supply unit 223, and the control unit 260 may perform a variety of preset functions using the operating voltage $V_{M2}$. In this case, the operating voltage $V_{M2}$ may be equal to the operating voltage $V_{M3}$.

The communication unit 230 includes an antenna 231 and a wireless communication circuit 232 operably coupled to each other, and is configured to operate using the operating voltage $V_{M1}$ supplied from the first master power supply unit 221.

The wireless communication circuit 232 may include a wireless transceiver 232a and a Micro Control Unit (MCU) 232b. The wireless transceiver 232a and the MCU 232b may be implemented as a semiconductor integrated into a single chip.

The communication unit 230 outputs the first switching signal in response to the operating voltage $V_{M1}$. Specifically, after initiating its operation by the operating voltage $V_{M1}$, the communication unit 230 outputs the first switching signal. The first switching signal outputted from the communication unit 130 is inputted to any one input terminal of the OR circuit 240.

The communication unit 230 may receive test result information from the control unit 260 through the isolation unit 250, and transmit a RF signal indicating the received test result information to the operator terminal 2.

The communication unit 230 may process (for example, demodulate) the RF signal received from the high-level control unit 1, the operator terminal 2 and/or the slave BMUs 100-1~100-n, and output to the control unit 260 through the isolation unit 250.

The communication unit 230 may receive pack information from the control unit 260 through the isolation unit 250, and transmit a RF signal indicating the received pack information to the high-level control unit 1. The pack information may include the pack voltage $V_P$, the pack current and/or the pack temperature detected by the sensing unit 210. Along with this or aside from this, the pack information may include module information collected from the slave BMUs 100-1~100-n via a wired or wireless network. The module information may include the module voltage, the module current and/or the module temperature of at least one of the plurality of battery modules 20-1~20-n.

The OR circuit 240 includes two or more input terminals, one output terminal and an OR operator. The OR circuit 240 outputs a signal representing the logical sum of signals inputted to two or more input terminals. Specifically, one input terminal of the OR circuit 240 receives the input of the first switching signal from the communication unit 230, and the other input terminal may receive the input of the first switching signal from the control unit 260 through the isolation unit 250.

The communication unit 230 outputs the first switching signal while the operating voltage $V_{M1}$ is being supplied. The control unit 260 may output the first switching signal independently of the communication unit 230 while the operating voltage $V_{M3}$ is being supplied.

When the first switching signal is inputted from at least one of the communication unit 230 and the control unit 260, the OR circuit 240 may output the first switching signal to the enable port ENA of the second master power supply unit 222 through the output terminal.

Meanwhile, an object (for example, an electric vehicle) in which the battery pack 10 is mounted may have an auxiliary power source $B_{AUX2}$. Even though the operating voltage $V_{M3}$ is supplied, when the control unit 260 is electrically connected to the auxiliary power source $B_{AUX2}$ through an auxiliary power terminal $T_{AUX}$ provided in the master BMU 200, the control unit 260 may stop outputting the first switching signal and output a second switching signal that is independent of the first switching signal. Only when as a result of the test performed by the master BMU 200, the master BMU 200 is determined to be normal, the battery pack 10 may be mounted in the object, and the second switching signal may be for blocking the wireless connection between the communication unit 230 and the operator terminal 2.

The second switching signal outputted from the master BMU 200 may be applied to a disable port DIS of the first master power supply unit 221 through the isolation unit 250. The first master power supply unit 221 may stop generating the operating voltage $V_{M1}$ supplied for the operation of the communication unit 230 in response to the second switching signal being applied to the disable port DIS. Accordingly, after the communication unit 230 is inactivated, the second master power supply unit 222 and the third master power supply unit 223 may be also inactivated subsequently, and the control unit 260 may be supplied with the operating voltage $V_{M4}$ of the auxiliary power source $B_{AUX2}$ and operate using the operating voltage $V_{M4}$.

Of course, even after the battery pack 10 is mounted in the object, the control unit 260 may continuously output the first switching signal, instead of outputting the second switching signal. In this case, the control unit 260 may be selectively supplied with one of the operating voltage $V_{M3}$ and the operating voltage $V_{M4}$ and operate using it. For example, while a predetermined number or more of battery cells 21 included in the battery pack 10 are in abnormal state such as overdischarge, the control unit 260 may be supplied with the operating voltage $V_{M4}$ rather than the operating voltage $V_{M3}$, and operate using the operating voltage $V_{M4}$. Otherwise, the control unit 260 may be supplied with the operating voltage $V_{M3}$ and operate using the operating voltage $V_{M3}$.

The isolation unit 250 is configured to relay communication between at least one of the plurality of slave BMUs 100-1~100-n, the sensing unit 210 and the communication unit 230 and the control unit 260. The isolation unit 250 includes at least one isolation element. Each isolation element includes a transmitter and a receiver, and may be a digital isolator, an opto coupler or a RF isolator with an isolation barrier between the input side and the output side.

The control unit 260 is operably coupled to the sensing unit 210, the at least one master power supply unit 221~223, the communication unit 230, the OR circuit 240 and the isolation circuit 250. The control unit 260 is configured to manage the overall operation of the master BMU 200. Additionally, the control unit 260 may calculate a State Of Charge (SOC) and/or a State Of Health (SOH) of each of the plurality of slave BMUs 100 based on a wireless signal corresponding to sensing information of each of the plurality of slave BMUs 100 among wireless signals received through the master antenna 221. Additionally, the control unit 260 may generate a control signal for controlling the charging, discharging and/or balancing of each of the plurality of slave BMUs 100 based on the calculated SOC and/or SOH, and selectively transmit it to at least one of the plurality of slave BMUs 100 through the master antenna 231 and the communication unit 230.

The control unit 260 includes at least one MCU, and each MCU may selectively include an application-specific integrated circuit (ASIC), a chipset, a logic circuit, a register, a communication modem and a data processing device known in the art to execute various control logics. At least one control logic of the control unit 260 may be combined, and the combined control logic may be written in computer-readable code system and recorded in computer-readable recording medium. The recording medium is not limited to a particular type and includes any type of recording media that can be accessed by a processor included in a computer. For example, the recording medium includes at least one selected from the group consisting of ROM, RAM, register, CD-ROM, magnetic tape, hard disk, floppy disk and optical data recording device. Additionally, the code system may be modulated to a carrier signal and included in a communication carrier at a specified point in time, and may be stored and executed in computers connected via a network in distributed manner. Additionally, functional programs, codes and code segments for implementing the combined control logics may be readily inferred by programmers in the technical field to which the present disclosure belongs.

The control unit 260 may test at least one item related to at least one battery module 20 and/or at least one slave BMU 100 based on at least one of the pack information from the sensing unit 110 and the module information from the plurality of slave BMUs 100-1~100-n until the battery pack 10 is installed in the object (for example, an electric vehicle). For example, the item to test may include a failure in the sensing unit 210, and whether or not the difference between the sum of module voltages of the plurality of battery modules 20-1~20-n and the pack voltage $V_P$ of the battery pack 10 exceeds the threshold difference.

Additionally, the control unit 260 transmits the test result information representing the result of the test performed by the control unit 260 to the wireless transceiver 232a through the isolation unit 250. The wireless transceiver 232a may transmit the RF signal including the test result information from the control unit 260 to the operator terminal 2 through the antenna 231.

The memory 261 may store an ID table. The ID table includes each ID assigned to the plurality of slave BMUs 100-1~100-n. The memory 261 is not limited to a particular type and includes any known information storage means capable of recording, deleting, updating and reading data. For example, the memory 261 may be DRAM, SDRAM, flash memory, ROM, EEPROM, and register. The memory 261 may store program codes defining the processes that can be executed by the control unit 170. Meanwhile, the memory 261 may be physically separated from the control unit 260, or may be integrated into a chip with the control unit 260.

Referring to FIGS. 1 to 4, after the battery pack 10 including the battery management system 30 is installed in the object (for example, an electric vehicle), the battery management system 30 may individually manage the plurality of battery modules 20-1~20-n according to the command from the high-level control unit 1 provided in the object.

When the master BMU 200 receives an ignition signal from the high-level control unit 1 for the first time, the master BMU 200 may transmit the notification signal to the plurality of slave BMUs 100-1~100-n. The ignition signal may be for notifying that the battery pack 10 including the battery management system 30 is normally installed in the specified object and can operate according to the command from the high-level control unit 1. Additionally, the notification signal may be for notifying that the use of the battery pack 10 has started to the plurality of slave BMUs 100-1~100-n.

The high-level control unit 1 receives state information of the plurality of battery modules 100-1~100-n collected by the master BMU 200 from the master BMU 200. Additionally, the high-level control unit 1 outputs, to the master BMU 200, a variety of commands for controlling the battery management system 30 based on the state information of the plurality of battery modules 100-1~100-n received from the master BMU 200.

The master BMU 200 may perform communication with the plurality of slave BMUs 100-1~100-n or the high-level control unit 1 selectively using a wired network and a wireless network.

When all the plurality of slave BMUs 100-1~100-n and the master BMU 200 can normally operate, the master BMU 200 may communicate with the plurality of slave BMUs 100-1~100-n via a wired network such as Daisy Chain (DC), and in the event of an occurrence of a failure in at least one of the plurality of slave BMUs 100-1~100-n 200 or the wired network, may communicate with the plurality of slave BMUs 100-1~100-n via a wireless network.

The master BMU 200 may transmit information indicating the congestion level of wired network and/or the congestion level of wireless network to the plurality of slave BMUs 100-1~100-n via the wired network and/or the wireless network. When the congestion level of wired network exceeds the threshold, the master BMU 200 may communicate with the plurality of slave BMUs 100-1~100-n using the wireless network. In contrast, when the congestion level of wireless network exceeds the threshold, the master BMU 200 may communicate with the plurality of slave BMUs 100-1~100-n using the wired network.

The embodiments of the present disclosure described hereinabove are not implemented only through the apparatus and method, and may be implemented through programs that realize the functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. A master battery management unit for a battery pack, the battery pack including a plurality of battery modules and a plurality of slave battery management units installed in the plurality of battery modules in a one-to-one ratio, the master battery management unit comprising:
   a sensing unit configured to detect an electrical parameter including a pack voltage of the plurality of battery modules of the battery pack, and generate pack information based on the detected electrical parameter;
   a first master power supply unit configured to generate a first operating voltage using the pack voltage supplied directly from the plurality of battery modules, wherein the first master power supply unit includes a device capable of converting the pack voltage to the first operating voltage;
   a communication unit including an antenna and a wireless communication circuit operably connected to each other, and configured to operate using the first operating voltage supplied from the first master power supply unit, and output a first switching signal in response to the first operating voltage;
   a second master power supply unit configured to generate a second operating voltage using the pack voltage supplied directly from the plurality of battery modules in response to the first switching signal, wherein the second master power supply unit includes a device capable of converting the pack voltage to the second operating voltage; and
   a control unit configured to operate using the second operating voltage supplied from the second master power supply unit, and test a preset item based on at least one of the pack information and module information from the plurality of slave battery management units,
   wherein the master battery management unit is configured to control each of the plurality of slave battery management units.

2. The master battery management unit according to claim 1, further comprising:

a third master power supply unit configured to generate a third operating voltage using the second operating voltage supplied from the second master power supply unit, wherein the control unit is further configured to operate using the third operating voltage.

3. The master battery management unit according to claim 1, further comprising:
an isolation unit configured to relay communication between at least one of the plurality of slave battery management units, the sensing unit and the communication unit and the control unit.

4. The master battery management unit according to claim 1, wherein the control unit is configured to output the first switching signal independently of the communication unit while the control unit is in operation.

5. The master battery management unit according to claim 4, further comprising:
an OR circuit including a first input terminal, a second input terminal and an out terminal,
wherein the first input terminal of the OR circuit receives an input of the first switching signal from the communication unit,
the second input terminal of the OR circuit receives an input of the first switching signal from the control unit, and
the output terminal of the OR circuit outputs the first switching signal from the communication unit or the first switching signal from the control unit to the second master power supply unit.

6. The master battery management unit according to claim 1, wherein the control unit is configured to stop outputting the first switching signal and output a second switching signal that is independent of the first switching signal when the control unit is electrically connected to an auxiliary power source provided in an object in which the battery pack is mounted, and the first master power supply unit is configured to stop generating the first operating voltage supplied for operation of the communication unit in response to the second switching signal.

7. The master battery management unit according to claim 1, wherein the communication unit is configured to transmit a RF signal indicating a result of the test to an external operator terminal through the antenna and the wireless communication circuit.

8. A battery management system comprising:
the master battery management unit according to claim 1.

9. A battery pack comprising:
the battery management system according to claim 8.

10. The battery management system according to claim 8, further comprising a plurality of slave battery management units,
wherein each slave battery management unit includes:
a first power supply unit;
a communication unit;
a sensing unit including a voltage measurement circuit configured to:
detect a voltage of each battery cell included a respective one of a plurality of battery modules; and
output a detection signal including the voltage of each battery cell to the communication unit; and
a cell balancing assembly configured to selectively perform cell balancing of each of the plurality of battery cells included in the respective battery module in response to a balancing command from the communication unit.

11. The master battery management unit according to claim 1, wherein the preset item is part of the master battery management unit or is a part of at least one of the plurality of slave battery management units.

12. The master battery management unit according to claim 11, wherein the preset item is a sensing unit or a cell balancing unit of a respective one of the plurality of slave battery management units.

* * * * *